(12) United States Patent
Shen et al.

(10) Patent No.: US 10,114,080 B2
(45) Date of Patent: Oct. 30, 2018

(54) LED LIGHTING DEVICE AND A METHOD TO VERIFY ITS LIFESPAN

(71) Applicant: ZHEJIANG SHENGHUI LIGHTING CO., LTD, Jiaxing (CN)

(72) Inventors: Jinxiang Shen, Jiaxing (CN); Fang Chen, Jiaxing (CN); Yehua Wan, Jiaxing (CN)

(73) Assignee: ZHEJIANG SHENGHUI LIGHTING CO., LTD, Jiaxing (CN)

(*) Notice: Subject to any disclaimer, the term of this patent is extended or adjusted under 35 U.S.C. 154(b) by 126 days.

(21) Appl. No.: 15/216,353

(22) Filed: Jul. 21, 2016

(65) Prior Publication Data

US 2017/0010333 A1 Jan. 12, 2017

Related U.S. Application Data

(63) Continuation-in-part of application No. 14/250,871, filed on Apr. 11, 2014, now abandoned, which is a
(Continued)

(30) Foreign Application Priority Data

Aug. 16, 2012 (CN) .......................... 2012 1 0292622

(51) Int. Cl.
*G01R 31/00* (2006.01)
*G01R 31/44* (2006.01)
(Continued)

(52) U.S. Cl.
CPC ............ *G01R 31/44* (2013.01); *F21V 23/005* (2013.01); *F21V 23/04* (2013.01); *H05B 33/089* (2013.01);
(Continued)

(58) Field of Classification Search
CPC .............................. H05B 33/884; H05B 33/89
See application file for complete search history.

(56) References Cited

U.S. PATENT DOCUMENTS 5,134,277 A * 7/1992 Yerbury ................. A01K 11/00
250/214 B
5,137,277 A 8/1992 Kitaue
(Continued)

FOREIGN PATENT DOCUMENTS

| CN | 2386449 Y | 7/2000 |
|---|---|---|
| CN | 201509347 A | 6/2010 |

(Continued)

*Primary Examiner* — Tung X Nguyen
*Assistant Examiner* — Dominic Hawkins
(74) *Attorney, Agent, or Firm* — Anova Law Group, PLLC

(57) ABSTRACT

The present invention provides an LED lighting device and a method for determining an operation time of the LED lighting device. The LED lighting device includes an LED module configured to emit light; an LED driver configured to supply power and drive the LED module; a micro controller unit (MCU) module that is connected to the LED driver and configured to measure an operation time of the LED lighting device; a display module that is connected to the MCU module and configured to receive the operation time sent from the MCU module and display the operation time; and a power supply module configured to supply power to the MCU module and the display module.

15 Claims, 3 Drawing Sheets

Related U.S. Application Data continuation-in-part of application No. PCT/CN2012/086612, filed on Dec. 24, 2012.

(51) Int. Cl.
  *H05B 33/08*  (2006.01)
  *F21V 23/04*  (2006.01)
  *F21V 23/00*  (2015.01)
  *F21Y 115/10* (2016.01)

(52) U.S. Cl.
  CPC ..... *H05B 33/0815* (2013.01); *H05B 33/0848* (2013.01); *F21Y 2115/10* (2016.08)

(56) References Cited

U.S. PATENT DOCUMENTS

| | | | | |
|---|---|---|---|---|
| 7,050,037 | B1* | 5/2006 | Kuramatsu | G09G 3/3406 340/7.61 |
| 8,471,564 | B2 | 6/2013 | Zimmermann et al. | |
| 8,643,287 | B2 | 2/2014 | Jou et al. | |
| 8,717,194 | B2* | 5/2014 | Nguyen | G08G 1/095 340/907 |
| 2006/0209195 | A1* | 9/2006 | Goto | G02B 7/102 348/219.1 |
| 2008/0224966 | A1* | 9/2008 | Cok | G09G 3/32 345/82 |
| 2009/0091467 | A1* | 4/2009 | Ries, II | H05B 33/0842 340/815.45 |
| 2009/0122276 | A1* | 5/2009 | Ito | H05B 37/029 353/87 |
| 2009/0184913 | A1* | 7/2009 | Sato | G09G 3/3648 345/99 |
| 2009/0273303 | A1* | 11/2009 | Peng | H05B 33/0818 315/297 |
| 2010/0164999 | A1* | 7/2010 | Chan | G09G 3/3406 345/690 |
| 2011/0254554 | A1* | 10/2011 | Harbers | H05B 33/0893 324/414 |
| 2014/0009161 | A1* | 1/2014 | Liu | G01R 31/44 324/414 |

FOREIGN PATENT DOCUMENTS

| | | |
|---|---|---|
| CN | 102413609 A | 4/2012 |
| CN | 102821523 A | 12/2012 |
| JP | 2004247273 A | 9/2004 |
| JP | 2012126514 A | 7/2012 |
| KR | 20120045429 A | 5/2012 |

* cited by examiner

LED LIGHTING DEVICE AND A METHOD TO VERIFY ITS LIFESPAN

CROSS-REFERENCES TO RELATED APPLICATIONS

This application is a continuation in part of U.S. patent application Ser. No. 14/250,871, filed on Apr. 11, 2014, which claims priority of PCT patent application No. PCT/CN2012/086612, filed on Dec. 24, 2012, which claims the priority of Chinese Patent Application No. 201210292622.7 filed on Aug. 16, 2012, the entire content of all of which are incorporated herein by reference.

FIELD OF THE DISCLOSURE

The present disclosure relates to the field of light emitting diode (LED) technologies and, more particularly, relates to an LED lighting device that is capable of tracking or monitoring its own lifespan, and relates to a method for verifying the lifespan of the LED lighting device.

BACKGROUND

With the rapid development of new energy-efficient lighting technologies, especially the LED technology, lighting products have become more efficient and durable. Compared with traditional incandescent lamps, the light conversion efficiency of an LED lamp may be 5 to 10 times higher, and the lifespan of an LED lamp may be 30 to 50 times longer. As a result, energy saving improvements have been well received by commercial and individual users. Moreover, innovative financing methods used in energy-saving projects, such as the Energy Management Contract (EMC) mode, attract more and more attention.

New lighting products such as LEDs have very long lifespans in theory. The lifespan of a lighting product may be defined as the duration during which its light intensity is maintained at, for example, above 70% of the original light intensity. Because there is no practical method to speed up the aging process to measure the lifespan of an LED lighting device, one conventional method is to measure a device's light intensity after 6,000 hours' aging to estimate its lifespan. Due to the rapid development of new energy-efficient LED technologies, one technology may become obsolete even before its product's lifespan can be fully tested. For LED manufacturers, this long test time span may cause problems. On the other hand, for LED device users, unless a device consistently fails in a relatively short time, it may be difficult to measure the real lifespan of a device. It may even be harder to compare the lifespan measurements to the claimed lifespan of a lighting product. For example, one product may claim that it has a lifespan of 25,000 hours. If it failed after 20,000 hours of usage, it would be difficult for the user to show a shorter than claimed lifespan.

As a result, estimating and verifying the lifespan of the new energy-efficient LED devices may be a challenge to device manufacturers and users. The disclosed method and system are directed to solve one or more problems set forth above and other problems

BRIEF SUMMARY OF THE DISCLOSURE

One aspect of the present disclosure provides an LED lighting device that is capable of measuring its own lifespan. The LED lighting device may include a controller configured to keep time for the LED lighting device's lifespan; a low voltage DC power source configured to supply power; a light intensity sensor configured to capture illuminance data; and a display terminal configured to be connected to the controller. Further, the controller may record time keeping data based on the illuminance data captured by the light intensity sensor and send the time keeping data to be displayed on the display terminal.

Further, the low voltage DC power source may be connected to the controller. The controller may be a microcontroller or a digital integrated circuit controller. The controller may be connected directly to the display terminal. The display terminal may be placed on the LED lighting device, and the controller may store or send time keeping measurements to the display terminal. The controller includes an internal timing circuit or a timing program.

In addition, the light intensity sensor may be placed at the luminous zone of the LED lighting device. The controller may capture the illuminance data and convert it into the luminous flux and the luminous flux maintenance factor. The light intensity sensor may be fixed on a substrate/PCB board, which is also used to hold the LED light source. The light intensity sensor may be placed at the center of the substrate/PCB board.

Moreover, the LED lighting device may include a cup that is placed outside the light intensity sensor and a shading slide that is placed above the light intensity sensor and on top of the LED lampshade.

Another aspect of the present disclosure provides a method for verifying the lifespan of an LED lighting device. The method includes placing a controller and a low voltage DC power source inside the LED lighting device; measuring the LED lighting device's lifespan based on illuminance data related to the LED lighting device; transferring data related to the LED lighting device's lifespan to a display terminal; and displaying the date related to the LED lighting device's lifespan in real time.

The method for verifying the lifespan of the LED lighting device may further include recording the illuminance data related to the LED lighting device at pre-set time intervals; transferring the illuminance data related to the LED lighting device to the controller; converting the illuminance data into a luminous flux and a luminous flux maintenance factor; and sending the luminous flux and a luminous flux maintenance factor to the display terminal.

Moreover, the method may include adding the pre-set interval of time to the lifespan of the LED lighting device when the measured luminous flux maintenance factor is less than a pre-defined value; and measuring an initial light intensity value after the LED device is powered on for 20 to 60 minutes; and measuring another 3 to 5 consequent light intensity values at a time interval of every 20 to 30 minutes.

In addition, the method for verifying the lifespan of the LED lighting device may include comparing the measured light intensity data to an initial light intensity value to determine a variance; and resetting the initial illuminance value if the variance is less than 10%. Further, the controller and the display terminal may be connected to an external low voltage DC power source.

Another aspect of the present disclosure provides a system for verifying the lifespan of an LED lighting device. The system may include an LED lighting device with one or more LED light sources; a controller configured to keep time of the LED lighting device lifespan; a light intensity sensor configured to capture illuminance data; and a display terminal configured to be attached to the LED lighting device. The controller may record time keeping data based on the illuminance data captured by the light intensity sensor and send the time keeping data to be displayed on the display terminal. In addition, the system may include a temperature sensor configured to capture the temperature of an LED light source, wherein the display terminal further displays temperature data related to the lifespan of the LED lighting device.

Another aspect of the present disclosure provides an LED lighting device. The LED lighting device may include an LED module configured to emit light; an LED driver configured to supply power and drive the LED module; a micro controller unit (MCU) module that is connected to the LED driver and configured to measure an operation time of the LED lighting device; a display module that is connected to the MCU module and configured to receive the operation time sent from the MCU module and display the operation time; and a power supply module configured to supply power to the MCU module and the display module.

Another aspect of the present disclosure provides a method for determining an operation time of an LED lighting device. The method may include placing a micro controller unit (MCU) module inside an LED lighting device. The LED lighting device includes an LED module configured to emit light, and an LED driver configured to supply power and drive the LED module, and the MCU module is connected to the LED driver. The method may further include measuring, by the MCU module, the operation time of the LED lighting device, including: detecting an output voltage of the LED driver; determining whether the LED driver is working based on the detected voltage; triggering an embedded timer to start accumulating the operation time when the LED driver is determined to be working; and stopping accumulating the operation time when the LED driver is determined to be not working. Further, the method may include sending the operation time to a display module; and displaying the operation time of the LED lighting device in real time.

Embodiments consistent with the present disclosure enable the user to monitor and manage the lifespans of LED lighting devices in real time.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
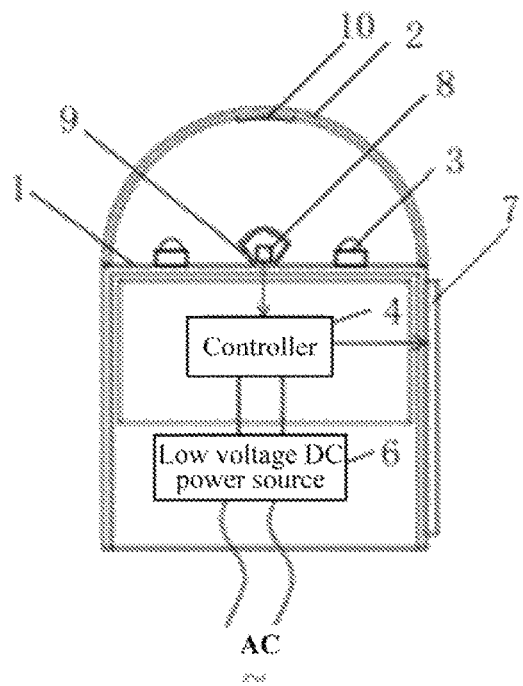
FIG. 1 depicts an exemplary LED lighting device configuration consistent with various disclosed embodiments.

An exemplary embodiment consistent with the present disclosure is described below. FIG. 1 illustrates an exemplary embodiment consistent with the present disclosure. The embodiment includes a substrate/PCB board 1, a lampshade 2, multiple LED light sources 3, a controller 4, a lower voltage DC power supply 6, a display terminal 7, a light intensity sensor 8, a cup 9, and a shading slide 10.

As shown in FIG. 1, the substrate/PCB board 1 and the lampshade 2 may be arranged at the upper portion of the LED lighting device. The LED light sources 3 may be fixed on the substrate/PCB board 1. The controller 4 and the low voltage DC power source 6 may be placed inside the LED lighting device. The controller 4 may be an MCU controller. Further, as shown in FIG. 1, the low voltage DC power supply 6 may be connected to the controller 4. The controller 4 may be connected to a display terminal 7. The display terminal 7 may be placed on the side of the LED lighting device, and may be an LCD display. In one embodiment, the light intensity sensor 8 may be placed at the luminous zone inside the LED lighting device. The light intensity sensor 8 may be connected to the controller 4. The light intensity sensor 8 may measure the illuminance of the LED lighting device. The controller 4 may read and convert the illuminance data from the sensor into the luminous flux maintenance factor, and may send the data to the display terminal 7. The light intensity sensor 8 may be placed at the center of the substrate/PCB board 1. The cup 9 may be set outside the light intensity sensor 8 to shield direct light from the LED light sources 3. A shading slide 10 may be placed above the light intensity sensor 8 and on top of the cup 9 to shade the sensor 8 from direct external light. One or more shading slides 10 may be placed at different positions of an LED device to shield light from undesirable light sources that may interfere with the readings of the sensor 8 (e.g., external light).

Depending on the configuration of the LED lighting device, the light intensity sensor 8 may be placed at different positions with various affiliated structures (e.g., cup 9 and shading slide 10) to properly measure the light intensity of the device. Further, multiple light intensity sensors 8 may be place in the LED lighting device to provide more accurate readings of the illuminance or provide back-up coverage. For example, for a more accurate illuminance reading, an LED lighting device may place two sensors in the device and use the average of the two sensors' readings as the measured illuminance value.

Figure 2:
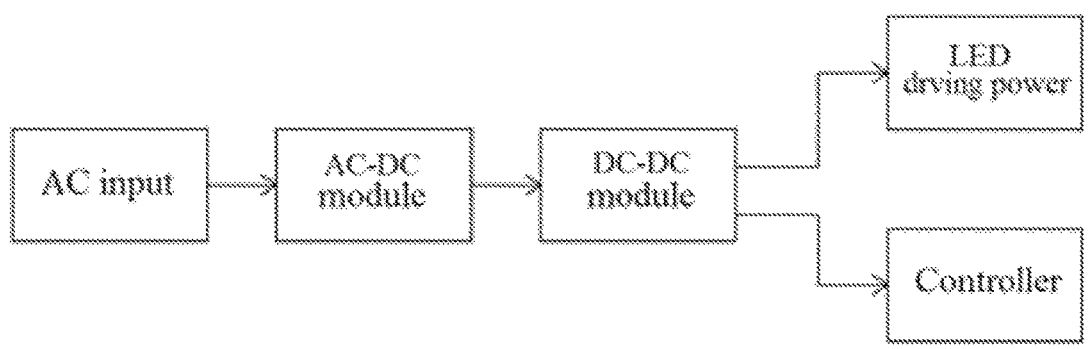
FIG. 2 depicts a schematic diagram of an exemplary micro controller unit (MCU) controller and power supply configuration consistent with various disclosed embodiments.

The controller 4 may need a low voltage DC power supply. Often, the LED power supply can also output low voltage DC power. For example, the low voltage DC power source 6 may supply power to the controller 4 directly. If other types of power source are used, as shown in FIG. 2, an AC-DC module and a DC-DC module may be needed for voltage conversions.

When the power is on, the LED light sources 3 may start emitting light. At the same time, the controller 4 may start keeping time. The lifespan time data may be displayed on the display terminal 7 in real time. The controller 4 may have a data protection function, which may keep track of the time data during a power-off period. When the power is turned on again, the controller 4 may resume time keeping. The time keeping functions may keep running until the LED light sources 3 cannot emit sufficient light. The final recorded and displayed duration may be the lifespan of the LED lighting device.

In one embodiment, the light intensity sensor 8 may take a first light intensity measurement 30minutes after the LED lighting device is powered on. Then, the sensor may take another three consequent light intensity measurements every 30minutes. The light intensity measurements may then be compared with an initial light intensity value, which may be provided by the LED manufacturer. If the variance is within 10%, the controller 4 may set the average of these measurements as the initial illuminance value. The sensor 8 may also send this initial illuminance value to the MCU controller 4. Thereafter, the light intensity sensor 8 may measure light intensity every 30 minutes. In some embodiments, the light intensity sensor 8 may be configured to not take the light intensity readings during the power-off processes.

Figure 3:
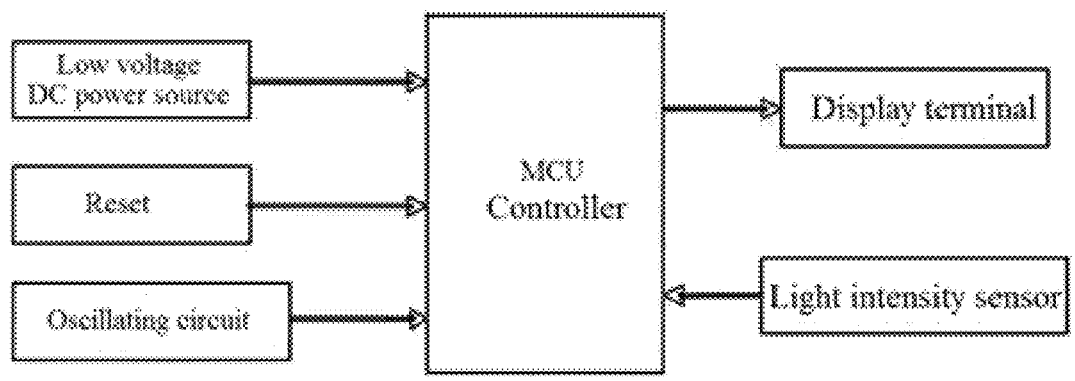
FIG. 3 is a schematic illustrating an exemplary controller module in the LED lighting device consistent with various disclosed embodiments.

As shown in FIG. 3 the MCU controller 4 may include an oscillating circuit and a reset circuit that may be used to implement the time keeping functions. Further, the MCU controller 4 may be connected to a lower voltage DC power supply 6, the light intensity sensor 8, and the display terminal 7. The controller 4 may retrieve the illuminance measurements from the light intensity sensor 8, compare the data with the initial illuminance value, convert the illuminance measurement data into the luminous flux and the luminous flux maintenance factor, and send the luminous flux and the luminous flux maintenance factor to the display terminal 7 in real time.

In one embodiment, when the measured luminous flux maintenance factor is lower than a pre-defined value, the recorded working time by the LED lighting device may be its lifespan. The pre-defined value may be defined based on specific applications. For example, the luminous flux maintenance factor threshold may be set at 70%. For different type of LED lighting devices, the threshold values may be different.

Figure 4:
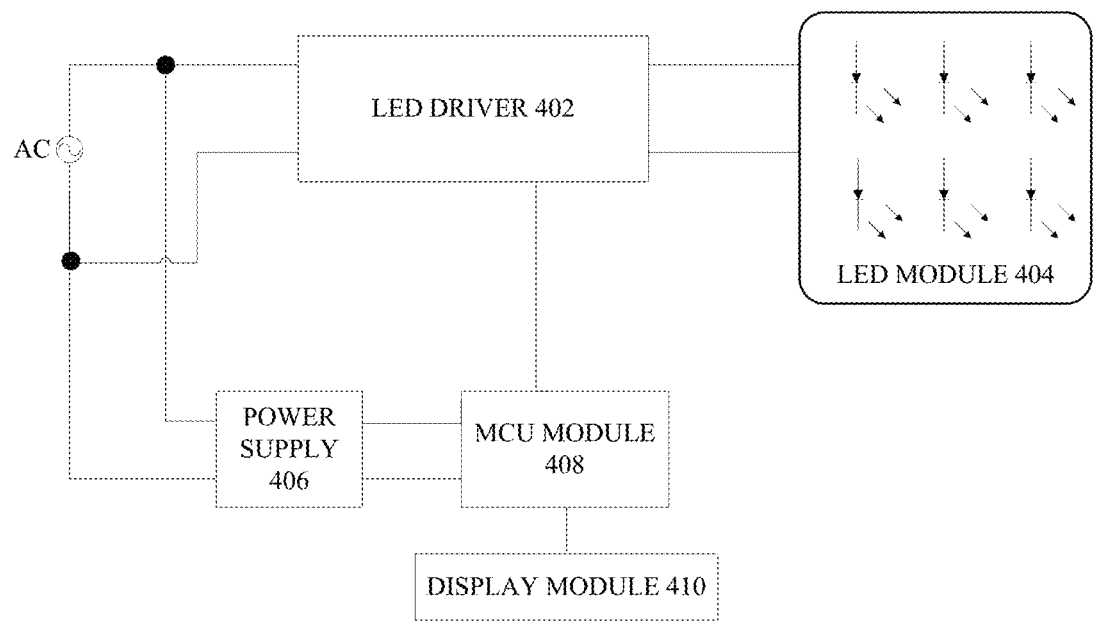
FIG. 4 is a schematic diagram of an exemplary system for determining the operation time of an LED lighting device consistent with various disclosed embodiments.

FIG. 4 illustrates a schematic diagram of an exemplary system for determining lifespan of an LED lighting device consistent with various disclosed embodiments. As shown in FIG.4, the exemplary system may include an LED driver 402, LED module 404, a power supply 406, a micro controller unit (MCU) 408, and a display module 410. The lifespan of the LED lighting device, as used herein, may refer to the normal operation time of the LED driver 402 and the LED module 404.

The LED driver 402 is connected to an AC power and configured to convert the AC power to a suitable DC voltage for driving the LED module 404. The LED module 404 is connected to the LED driver 402 and configured to emit light. The LED lighting device may further include a switch. After the LED driver 402 is connected to the AC power, the switch may control the power on or off of the LED lighting device.

The power supply 406 may be connected to the AC power and configured to convert AC power to a suitable DC voltage for the MCU module 408 and the display module 410. The MCU module 408 is connected to the LED driver 402. The MCU module 408 may be configured to record an operation time of the LED driver 402. Specifically, the MCU module 408 may be configured to detect an output voltage of the LED driver 402, determine whether the LED driver 402 is working based on the detected voltage, trigger an embedded timer to start timing (e.g., accumulating the operation time) when the LED driver 402 is determined to be working, and stop the timer from timing (e.g., stop accumulating the operation time) when the LED driver 402 is determined to be not working.

The operation time data maintained by the MCU module 408 may indicate the lifespan of the LED lighting device (e.g., normal operation time of the LED driver 402 and the LED module 404). For example, when the LED lighting device is powered on but the MCU module 408 determines that the LED driver 402 is not working, the current operation time recorded by the MCU module 408 may be the lifespan of the LED lighting device.

The MCU module 408 may be connected to the display module 410 and configured to transmit the operation time to the display module 410. The display module 410 may be configured to receive and display the operation time data in real-time. The display module 410 may further include an on/off switch. In one embodiment, the MCU module 408 may control the display module 410 to display the operation time only when it is determined that the LED driver 402 is working and the display module 410 is switched on. In another embodiment, the MCU module 408 may control the display module to display the operation time as long as the display module 410 is switched on, regardless of whether the LED light (e.g., LED module 404) is on or off.

In some embodiments, the display module 410 may be further configured to display the operation time in a user-selected format, such as in minutes, hours or days. For example, the display module 410 may include a physical toggle or button, and may switch among different time formats as a user pushes the toggle or button. Alternatively, the display module 410 may be a touch screen and include a virtual toggle or button for selecting time formats. In one embodiment, the MCU module 408 may process the user selection and convert the operation time into different formats for the display module 410 accordingly.

In some embodiments, the display module 410 may be further configured to display other information related to the LED lighting device based on user selection. For example, by default, the MCU module 408 may send the total operation time (e.g., since the very first time the LED lighting device is powered on) to the display module 410 for display. Upon a user selection (e.g., selecting a virtual or physical button), the MCU module 408 may send the operation time since the LED lighting device is powered on this time (e.g., the most recent time) for display. Upon another user selection, the MCU module 408 may send a data indicating number of times that the LED lighting device have been turned on/off for display. In one embodiment, the user may repeatedly select one button, and the MCU module 408 may control the display module 410 to circle through and display the three types of information one at a time.

In some embodiments, the LED driver 402, the power supply 406, and the MCU module 408 may all be placed inside the lighting fixture of the LED lighting device as shown in FIG. 1. In some embodiments, the LED driver 402, the power supply 406, and the MCU module 408 may be integrated on a same circuit board. When the LED lighting device is connected to the AC power, both the LED driver 402 and the power supply 406 are connected to the AC power. The display module 410 may be placed outside the lighting fixture of the LED lighting device. In one example, the display module 410 may be fixed on an outer wall of the LED lighting device. In another example, the display module 410 may be an external display module, and the LED lighting device may reserve a port on its lighting fixture for connecting the external display module to the MCU module 408.

Figure 5:
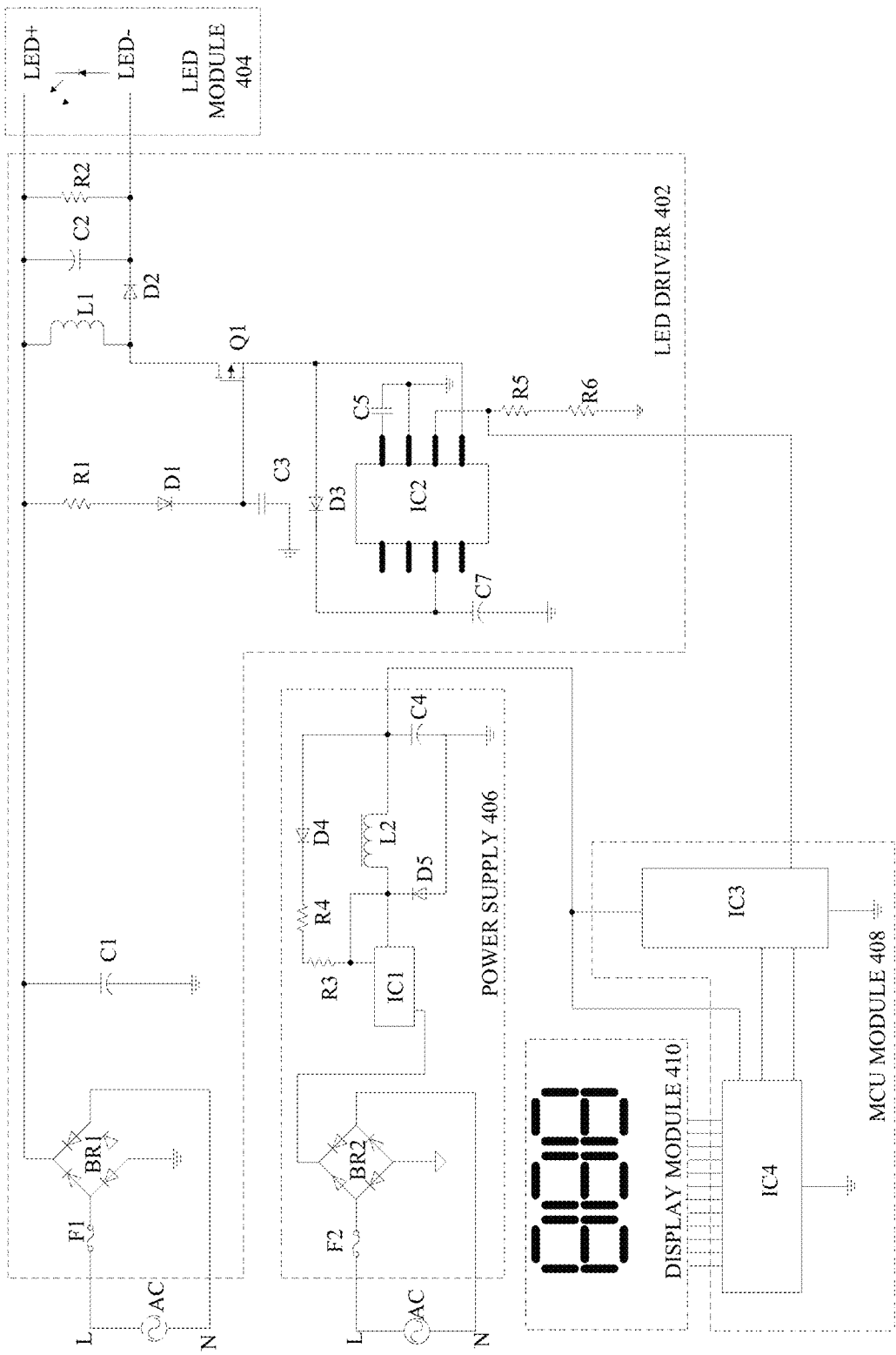
FIG. 5 is a circuit schematic of the exemplary system consistent with various disclosed embodiments

FIG. 5 illustrates a circuit schematic of the exemplary system for determining lifespan of an LED lighting device consistent with various disclosed embodiments. The dashed frames may indicate circuits corresponding to the modules as shown in FIG. 4.

As shown in FIG. 5, components of the circuit corresponding to the LED driver 402 may include an integrated circuit (IC) chip IC2 configured as the LED controller for driving the LED module 404 (e.g., LED light bulb) to emit light. In one embodiment, the LED controller may be a dimmable TRIAC LED controller with active power factor correction.

Specifically, the LED driver 402 may include a fuse F1 that fuses the AC input to protect the component failure or excessive short events, a diode rectifier BR1 that rectifies the input line voltage, and a capacitor C1, where F1, BR1, and C1 may compose the input stage of the LED driver 402. The LED driver 402 may further include a diode D3, a capacitor C7, and an external MOSFET Q1 for supplying power to the LED controller chip IC2 (via VCC pin). The LED driver 402 may further include a resistor R1, a diode D1, and a capacitor C3 used for gate driver of the external MOSFET Q1. The source of the external MOSFET Q1 is connected to the internal MOSFET Drain of the LED controller chip IC2 (via Drain pin). The LED driver 402 may further include a capacitor C7 for compensation; an inductor L3 for conduction; a diode D2 as the output rectifying diode; a capacitor C2 as the output filter; and a resistor R2 as a load to consume the output power in open load condition. Resistors R5 and R6 are connected to the internal main MOSFET Source of the LED controller chip IC2 (via Source pin), and are sensing resistors for the LED controller chip IC2.

The MCU module 408 may include a chip IC3 and a chip IC4. The chip IC3 may be configured to record the operation time of the LED driver 402. Specifically, the chip IC3 may include a clock (timer), an internal ADC interface and an internal comparator. The ADC interface may be connected to the source pin of the LED controller chip IC2, and convert the analog voltage signal from the chip IC2 to a digital voltage signal Vsense (e.g., voltage on R5 and R6). The chip IC3 may maintain an operation time data t1. The chip IC3 may be programmed to compare the detected voltage with a threshold voltage Vref at a regular time interval t2 (e.g., every minute), and determine whether to update the operation time data based on the comparison result. In one embodiment, when the comparison result indicates that the LED lighting device is working properly, the chip IC3 may update the operation time data t1 to be equal to t1+t2. When the comparison result indicates that the LED lighting device is not working properly, the chip IC3 may determine that the operation time data t1 remain unchanged. In another embodiment, when the comparison result indicates that the LED lighting device is working properly, the chip IC3 may trigger the timer to keep time for the operation time data until the comparison result indicates otherwise.

In one embodiment, when the chip IC3 determines that Vsense is greater than Vref, the chip IC3 may determine that the LED lighting device is working normally and accumulate/update the operation time data. In another embodiment, the chip IC3 may detect multiple consecutive measurements of Vsense in the regular time interval t2, and may determine to update the operation time data when all the consecutive measurements of Vsense are greater than Vref or when an average of the consecutive measurements of Vsense are greater than Vref.

In one embodiment, the value of Vref may be programmed to the chip IC3 according to an expected configuration of the LED lighting device (the LED driver 402 and the LED module 404) before the LED lighting device operates for the first time. In another embodiment, the chip IC3 may be programmed to use an initial measurement of Vsense as the value of Vref when the LED lighting device is powered on for the first time. For example, the chip IC3 may take the initial measurement of Vsense after the LED lighting device is powered on for the first time for a preset time period, such as for one minute, or for a time period equals t2, etc. In another example, the chip IC3 may take multiple measurements of Vsense after the LED lighting device is powered on for the first time, such as three measurements for the first three minutes, and use an average of the multiple measurements as the initial measurement. Further, the initial value of the operation time data t1 is set to zero before the lighting device is powered on for the first time. The time period spent by the chip IC3 for taking the initial measurements are added to the operation time data t1 when Vref is determined.

Further, the chip IC3 may be configured to keep a record of the detected voltage Vsense in a chronological order. In one example, the chip IC3 may log the detected voltage Vsense at every 10 hours of the operation time. In another example, the chip IC3 may keep the most recent five readings of the voltage Vsense detected at every hour of the operation time. In another example, the LED lighting device may be powered on and off multiple times, and the chip IC3 may further record power-on durations of the LED lighting device and a Vsense reading corresponding to each power-on duration. The Vsense reading may be a last measurement before the LED lighting device is powered off every time. The chip IC3 may also record how many times that the LED lighting device have been powered on/off.

In some embodiments, the data recorded by the chip IC3 may be stored in an internal non-transitory memory. Further, the chip IC3 may reserve a power supply and/or data transmission port for an external source, such as a USB port. When the LED lighting device is not working normally or not connected to the AC power, the external source may be connected to the chip IC3 through the port so that the recorded data (e.g., the operation time, the power-on durations, the voltage log, etc.) in the chip IC3 may be transmitted and read externally.

When the LED lighting device is powered on but the MCU module 408 determines that the LED driver 402 is not working (e.g., Vsense is not greater than Vref), the current operation time recorded by the MCU module 408 may indicate the lifespan of the LED lighting device.

As shown in FIG. 5, the power supply 406 may include a chip IC1, a fuse F2, a rectifier BR2, resistors R3 and R4, diode D5, inductor L2, and a capacitor C4. The power supply 406 may be connected to the chip IC3 and chip IC4 of the MCU module 408 to provide power. The MCU module 408 may include chip IC3 for determining the LED operation time and chip IC4 for controlling the display module 410. The chip IC3 may synchronize the clock signal with the chip IC4 (via clock pin), and send the operation time data to the chip IC4 (via data pin). The chip IC4 may control the display module 410 to present the operation time data. In some embodiments, chip IC3 and chip IC4 may be integrated in one microcontroller.

In some embodiments, the chip IC3 may send the operation time data to the chip IC4 and further for displaying by the display module 410 at a time interval according to the time display format. For example, when the time is displayed using hour as basic unit, the chip IC3 may send the operation time data to the chip IC4 every time the operation time has increased an hour.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

INDUSTRIAL APPLICABILITY AND ADVANTAGEOUS EFFECTS

Without limiting the scope of any claim and/or the specification, examples of industrial applicability and certain advantageous effects of the disclosed embodiments are listed for illustrative purposes. Various alternations, modifications, or equivalents to the technical solutions of the disclosed embodiments can be obvious to those skilled in the art and can be included in this disclosure.

In some embodiments consistent with the present disclosure, other than the light intensity sensors, other sensors may be attached to an LED lighting device to measure other environmental conditions, such as humidity, temperature, etc. The environmental data may also be sent to the controller. The controller may keep track of various environmental conditions, and keep track of the device operation time for these conditions. For example, if an LED lighting device has a 2,000-hour lifespan, the controller may generate data showing that 500 of the 2,000 hours were in a raining environment, 800 of the 2,000 hours were below the freezing temperature, etc. The display terminal may also display lifespan information in combination with environmental information in real time.

In some embodiments consistent with the present disclosure, sensors may be place next to or may be attached to the LED light sources to measure the temperature of the light sources. The controller may receive the temperature data and keep track of the operation time for various temperature ranges. For example, for an LED device with a 2,000-hour lifespan, the controller may generate data showing the temperature readings for the 2,000 operational hours.

In other embodiments consistent with the present disclosure, an LED lighting device manufacturer may place a wireless communication module in the LED lighting device. The controller may then send data related to the lifespan data of the LED lighting device through the wireless communication module to other software/hardware modules. For example, the controller may use the wireless module to send the device operation data to an LED lighting device management system. The device management system may then display the data through any type of user interfaces, including an online user interface. The user may then monitor the status of the LED lighting devices remotely to determine whether certain devices need to be replaced or repaired. This type of remote device monitoring can also be used in combination with the on-site monitoring (e.g., through a display terminal on the LED lighting device) to monitor and manage LED lighting devices as needed.

Embodiments consistent with the present disclosure may use one or multiple sensors to measure light intensity, LED operational conditions, and LED device operational conditions. The controller may keep track of the lifespan data as well as other measures related to operations of the LED lighting device. The controller may send the data related to the LED operations and other conditions to the display terminal to be displayed.

What is claimed is:

1. An LED lighting device, comprising:
   an LED module configured to emit light;
   an LED driver configured to supply power and drive the LED module;
   a micro controller unit (MCU) module that is connected to the LED driver and configured to measure an operation time of the LED lighting device;
   a display module that is connected to the MCU module and configured to receive the operation time sent from the MCU module and display the operation time; and
   a power supply module configured to supply power to the MCU module and the display module, wherein:
   the MCU module is further configured to:
      detect an output voltage of the LED driver,
      determine whether the LED driver is working by comparing the detected output voltage with a threshold voltage,
      determine that the LED driver is working when the detected output voltage is greater than the threshold voltage,
      trigger an embedded timer to start accumulating the operation time when the LED driver is determined to be working, and
      stop accumulating the operation time when the LED driver is determined to be not working.

2. The LED lighting device according to claim 1, wherein the MCU module is further configured to:
   detect an initial output voltage of the LED driver at a preset time period after the LED lighting device is turned on for the first time; and
   use the initial output voltage as the threshold voltage.

3. The LED lighting device according to claim 1, wherein the MCU module is further configured to:
   determine whether the LED driver is working by comparing multiple consecutive measurements of the detected output voltage in a preset time period with a threshold voltage, respectively; and
   when each or an average of the multiple consecutive measurements of the detected output voltage is greater than the threshold voltage, determine that the LED driver is working.

4. The LED lighting device according to claim 1, wherein the MCU module is further configured to:
   detect the output voltage of the LED driver periodically at a preset time interval;
   determine whether the LED driver is working based on the detected output voltage;
   when the LED driver is determined to be working, update the operation time by adding the preset time interval to a current operation time; and
   when the LED driver is determined to be not working, keep the current operation time unchanged.

5. The LED lighting device according to claim 1, wherein:
   the MCU module includes an internal analog-to-digital converter interface configured to convert an analog output signal of the LED driver to the detected output voltage.

6. The LED lighting device according to claim 5, wherein:
   the MCU module is connected to a source pin of a controller chip of the LED driver to receive the analog output signal from the LED driver.

7. The LED lighting device according to claim 1, wherein:
   the display module is further configured to receive a user selection to change a display time unit of the operation time; and the MCU module is further configured to convert the operation time according to the selected time unit, and send the converted time to the display module for display.

8. The LED lighting device according to claim 1, wherein:
when the LED lighting device is powered on and the MCU module determines that the LED driver is not working, the operation time recorded by the MCU module is a lifespan of the LED lighting device.

9. A method for determining an operation time of an LED lighting device, comprising:
placing a micro controller unit (MCU) module inside an LED lighting device, wherein the LED lighting device includes an LED module configured to emit light, and an LED driver configured to supply power and drive the LED module, and the MCU module is connected to the LED driver;
measuring, by the MCU module, the operation time of the LED lighting device, including:
detecting an output voltage of the LED driver;
determining whether the LED driver is working by comparing the detected output voltage with a threshold voltage;
determining that the LED driver is working when the detected output voltage is greater than the threshold voltage;
triggering an embedded timer to start accumulating the operation time when the LED driver is determined to be working; and
stopping accumulating the operation time when the LED driver is determined to be not working;
sending the operation time to a display module; and
displaying the operation time of the LED lighting device in real time.

10. The method according to claim 9, further comprises:
detecting, by the MCU module, an initial output voltage of the LED driver at a preset time period after the LED lighting device is turned on for the first time; and
using the initial output voltage as the threshold voltage.

11. The method according to claim 9, wherein measuring, by the MCU module, the operation time of the LED lighting device further comprises:
detecting the output voltage of the LED driver periodically at a preset time interval;
determining whether the LED driver is working based on the detected output voltage;
when the LED driver is determined to be working, updating the operation time by adding the preset time interval to a current operation time; and
when the LED driver is determined to be not working, keeping the current operation time unchanged.

12. The method according to claim 9, wherein:
the MCU module includes an internal analog-to-digital converter interface configured to convert an analog output signal of the LED driver to the detected voltage.

13. The method according to claim 12, wherein:
the MCU module is connected to a source pin of a controller chip of the LED driver to receive the analog output signal from the LED driver.

14. The method according to claim 9, further comprising:
receiving a user selection to change a display time unit of the operation time; and
converting, by the MCU module, the operation time according to the selected time unit, and
sending the converted time to the display module for display.

15. A method for determining an operation time of an LED lighting device, comprising:
placing a micro controller unit (MCU) module inside an LED lighting device, wherein the LED lighting device includes an LED module configured to emit light, and an LED driver configured, to supply power and drive the LED module, and the MCU module is connected to the LED driver;
measuring, by the MCU module, the operation time of the LED lighting device, including:
detecting an output voltage of the LED driver;
determining whether the LED driver is working by comparing multiple consecutive measurements of the detected output voltage in a preset time period with a threshold voltage;
determining that the LED driver is working when each or an average of the multiple consecutive measurements of the detected output voltage is greater than the threshold voltage;
triggering an embedded timer to start accumulating the operation time when the LED driver is determined to be working; and
stopping accumulating the operation time when the LED driver is determined to be not working;
sending the operation time to a display module; and
displaying the operation time of the LED lighting device in real time.

* * * * *